US012672320B2

(12) United States Patent
Seol et al.

(10) Patent No.: US 12,672,320 B2
(45) Date of Patent: Jun. 30, 2026

(54) COMPLEX OF HETEROGENEOUS TWO-DIMENSIONAL MATERIALS AND METHOD OF MANUFACTURING THE SAME

(71) Applicants: Samsung Electronics Co., Ltd., Suwon-si (KR); UNIST (ULSAN NATIONAL INSTITUTE OF SCIENCE AND TECHNOLOGY), Ulsan (KR)

(72) Inventors: Minsu Seol, Seoul (KR); Hyeonsuk Shin, Ulsan (KR); Kyung-Eun Byun, Seongnam-si (KR); Hyuntae Hwang, Mokpo-si (KR); Changseok Lee, Suwon-si (KR); Hyeongjoon Kim, Bucheon-si (KR)

(73) Assignees: Samsung Electronics Co., Ltd., Gyeonggi-do (KR); UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 642 days.

(21) Appl. No.: 18/066,659

(22) Filed: Dec. 15, 2022

(65) Prior Publication Data

US 2023/0197837 A1 Jun. 22, 2023

(30) Foreign Application Priority Data

Dec. 16, 2021 (KR) ........................ 10-2021-0181076

(51) Int. Cl.
H10D 48/36 (2025.01)
H10D 62/80 (2025.01)
(Continued)

(52) U.S. Cl.
CPC ........... H10D 48/362 (2025.01); H10D 62/80 (2025.01); H10D 62/82 (2025.01); (Continued)

(58) Field of Classification Search
CPC ...... H10D 48/362; H10D 62/80; H10D 62/82; H10D 62/8503; H10D 62/882; (Continued)

(56) References Cited

U.S. PATENT DOCUMENTS

| | | | |
|---|---|---|---|
| 7,968,674 B2 | 6/2011 | Choi et al. | |
| 7,988,941 B2 | 8/2011 | Choi et al. | |

(Continued)

FOREIGN PATENT DOCUMENTS

| | | | |
|---|---|---|---|
| CN | 106328720 A | | 1/2017 |
| CN | 206022376 U | * | 3/2017 |

(Continued)

OTHER PUBLICATIONS

Translation of Xiaozhi (CN206022376U) (Year: 2017).*

(Continued)

*Primary Examiner* — William B Partridge
*Assistant Examiner* — Ilker Ozden
(74) *Attorney, Agent, or Firm* — HARNESS, DICKEY & PIERCE, P.L.C.

(57) ABSTRACT

Provided are a complex of heterogeneous two-dimensional materials and a method of manufacturing the same. The complex of heterogeneous two-dimensional materials may include a substrate; a first two-dimensional material layer on the substrate and having a two-dimensional crystal structure; and a second two-dimensional material layer between the substrate and the first two-dimensional material layer. The second two-dimensional material layer have a two-dimensional crystal structure in which a plurality of phosphorus atoms are covalently bonded to each other.

17 Claims, 11 Drawing Sheets

(51) Int. Cl.

| | |
|---|---|
| *H10D 62/82* | (2025.01) |
| *H10D 62/85* | (2025.01) |
| *H10P 14/20* | (2026.01) |
| *H10P 14/24* | (2026.01) |

(52) U.S. Cl.
CPC ....... *H10D 62/8503* (2025.01); *H10D 62/882* (2025.01); *H10P 14/24* (2026.01); *H10P 14/3402* (2026.01); *H10P 14/3406* (2026.01); *H10P 14/3416* (2026.01); *H10P 14/3436* (2026.01)

(58) Field of Classification Search
CPC ........... H10D 30/0323; H10D 30/6757; H10D 62/81; H01L 21/02521; H01L 21/02527; H01L 21/0254; H01L 21/02568; H01L 21/0262; H01L 21/02439; H01L 21/02513; H01L 21/02612; H01L 21/0259; H01L 21/02587; H01L 21/02675; H01L 21/02664; H10P 14/24; H10P 14/3402; H10P 14/3406; H10P 14/3416; H10P 14/3436; H10P 14/20; H10P 14/3452; H10P 14/3202; H10P 14/3256; H10P 14/3451; H10P 14/3808; H10P 14/38

See application file for complete search history.

(56) References Cited

U.S. PATENT DOCUMENTS

| | | | |
|---|---|---|---|
| 8,133,466 | B2 | 3/2012 | Shin et al. |
| 8,283,038 | B2 | 10/2012 | Choi et al. |
| 8,535,553 | B2 | 9/2013 | Kong et al. |
| 8,623,761 | B2 | 1/2014 | Bonilla et al. |
| 8,723,024 | B2 | 5/2014 | Choi et al. |
| 8,895,433 | B2 | 11/2014 | Bonilla et al. |
| 8,906,787 | B2 | 12/2014 | Park et al. |
| 8,912,530 | B2 | 12/2014 | Yang et al. |
| 9,040,957 | B2 | 5/2015 | Lee et al. |
| 9,056,424 | B2 | 6/2015 | Wenxu et al. |
| 9,064,777 | B2 | 6/2015 | Heo et al. |
| 9,108,848 | B2 | 8/2015 | Woo et al. |
| 9,324,634 | B2 | 4/2016 | Bao et al. |
| 9,324,635 | B2 | 4/2016 | Bao et al. |
| 9,359,211 | B2 | 6/2016 | Woo et al. |
| 9,472,450 | B2 | 10/2016 | Bonilla et al. |
| 9,527,043 | B2 | 12/2016 | Choi et al. |
| 9,533,265 | B2 | 1/2017 | Choi et al. |
| 9,583,358 | B2 | 2/2017 | Kim et al. |
| 9,721,734 | B2 | 8/2017 | Ryu et al. |
| 10,325,987 | B2 | 6/2019 | Park et al. |
| 10,636,654 | B2 | 4/2020 | Xia |
| 2011/0127471 | A1 | 6/2011 | Shin et al. |
| 2013/0059155 | A1 | 3/2013 | Choi et al. |
| 2014/0087191 | A1 | 3/2014 | Chua et al. |
| 2014/0239256 | A1* | 8/2014 | Kim ...................... H10D 62/82 257/29 |
| 2015/0235959 | A1 | 8/2015 | Lee et al. |
| 2016/0005609 | A1* | 1/2016 | Di ........................ H10D 30/015 438/287 |
| 2018/0012962 | A1* | 1/2018 | Yeh ...................... H10D 62/151 |
| 2018/0148338 | A1 | 5/2018 | Yu |
| 2018/0151751 | A1* | 5/2018 | Yeh ........................ H10D 99/00 |
| 2018/0294156 | A1* | 10/2018 | Xia ........................ H10P 14/22 |
| 2019/0074179 | A1 | 3/2019 | Park et al. |
| 2021/0020765 | A1* | 1/2021 | Cho ................... H10D 30/6757 |
| 2021/0193801 | A1* | 6/2021 | Wang ................... H10D 62/149 |
| 2021/0234015 | A1* | 7/2021 | Lee .................... H01L 21/0254 |
| 2022/0157947 | A1 | 5/2022 | Seol et al. |

FOREIGN PATENT DOCUMENTS

| | | | | | |
|---|---|---|---|---|---|
| CN | 107644906 | A | * | 1/2018 | |
| EP | 3855507 | A1 | | 7/2021 | |
| JP | 2001176814 | A | * | 6/2001 | |
| KR | 2013/0006870 | A | | 1/2013 | |
| KR | 20160107556 | A | | 9/2016 | |
| KR | 20180059331 | A | | 6/2018 | |
| KR | 2019/0026140 | A | | 3/2019 | |
| KR | 20190042291 | A | | 4/2019 | |
| KR | 20200137790 | A | * | 12/2020 | ............ H05B 33/14 |
| KR | 2021/0095459 | A | | 8/2021 | |
| KR | 20220067845 | A | | 5/2022 | |
| WO | WO-2018/009931 | A1 | | 1/2018 | |

OTHER PUBLICATIONS

Lu et al., Phys. Chem. Chem. Phys., 2018,20, 11967-11975, doi.org/10.1039/C8CP01364K (Year: 2018).*

Pantano et al. âinvestigation of charges-driven interactions between graphene and different SiO2 surfacesâ, Carbon, vol. 148, 2019, https://doi.org/10.1016/j.carbon.2019.03.071. (Year: 2019).*

Translation of Hideharu (JP2001176814A) (Year: 2001).*

Ida M, Miyatake K, Kimura A. Analysis of red phosphorus in resins using pyrolysis-gas chromatography/mass spectrometry. Anal Sci. Apr. 2008;24(4):539-42. doi: 10.2116/analsci.24.539. PMID: 18403850. (Year: 2008).*

Saha et al. Comprehensive characterization and analysis of hexagonal boron nitride on sapphire. AIP Advances May 1, 2021; 11 (5) : 055008. doi.org/10.1063/5.0048578. (Year: 2021).*

Roy et al., Structure, Properties and Applications of Two-Dimensional Hexagonal Boron Nitride. Adv. Mater. 2021, 33, 2101589. doi.org/10.1002/adma.202101589 (Year: 2021).*

Translation of CN 206022376 U (Xiaozhi) (Year: 2016).*

G. Qiu, Q. Nian, M. Motlag, S. Jin, B. Deng, Y. Deng, A. R. Chamnas, P. D. Ye, G. J. Cheng, Adv. Mater. 2018, 30, 1704405. https://doi.org/10.1002/adma.201704405 (Year: 2018).*

Translation of CN 107644906 A (Zhang) (Year: 2018).*

Translation of JP 2001176814 A (Hideharu) (Year: 2001).*

Translation of Lee (KR 20200137790 A) (Year: 2020).*

Translation of CN 206022376 U (Year: 2017).*

Qiu et al., Adv. Mater. 2018, 30, 1704405. https://doi.org/10.1002/adma.201704405 (Year: 2018).*

Translation of CN 107644906 A (Year: 2018).*

Translation of KR 20200137790 A (Year: 2020).*

Lu et al., 'Low-Noise Mid-Infrared Photodetection in BP/h-BN/Graphene van der Waals Heterojunctions' *Materials*, 2019, vol. 12, No. 16, 2532.

Ra et al., 'Dual-Gate Black Phosphorus Field-Effect Transistors with Hexagonal Boron Nitride as Dielectric and Passivation Layers' *ACS Appl. Mater. Interfaces*, 2018, vol. 10, No. 1, pp. 925-932.

Extended European Search Report, dated Apr. 26, 2023, issued in corresponding European Patent Application No. 22210798.9.

Nezhueyotl Izquierdo et al., "Thin-Film Deposition of Surface Passivated Black Phosphorus", ACS Nano, 13, 7091-7099. (2019).

G. Qiu et al, Ultrafast Laser-Shock-Induced Confined Metaphase Transformation for Direct Writing of Black Phosphorus Thin Films, Adv. Mater. 2018, 30, 1704405. https://doi.org/10.1002/adma.201704405.

Korean Office Action dated Sep. 16, 2025 for corresponding Korean Patent Application No. 10-2021-0181076 and its English-language translation.

Hsu-Sheng Tsai et al., Plasma-Assisted Synthesis of High-Mobility Atomically Layered Violet Phosphorus, ACS Applied Materials & Interfaces 2015 7 (25), 13723-13727. DOI: 10.1021/acsami.5b03803.

* cited by examiner

→ Graphene

→ Violet Phosphorus

→ SiO₂

20 nm

1700

1800

COMPLEX OF HETEROGENEOUS TWO-DIMENSIONAL MATERIALS AND METHOD OF MANUFACTURING THE SAME

CROSS-REFERENCE TO RELATED APPLICATION

This application is based on and claims priority under 35 U.S.C. § 119 to Korean Patent Application No. 10-2021-0181076, filed on Dec. 16, 2021 in the Korean Intellectual Property Office, the disclosure of which is incorporated by reference herein in its entirety.

BACKGROUND

1. Field

The present disclosure relates to a complex of heterogeneous two-dimensional materials and/or a method of manufacturing the same.

2. Description of the Related Art

A two-dimensional material is a material having a two-dimensional crystal structure. The two-dimensional material may be stable and may have excellent physical properties even at a small thickness of about 1 nm or less. Accordingly, the two-dimensional material is attracting attention as a material capable of overcoming performance degradation due to the scale-down of bulk materials.

Among two-dimensional materials, black phosphorus or violet phosphorus, which is a phosphorus-based two-dimensional material, has a high charge mobility and a bandgap unlike graphene, and thus, black phosphorus or violet phosphorus may secure an on/off current ratio. Accordingly, black phosphorus or violet phosphorus may be applied to electronic devices in various fields.

SUMMARY

Provided are a complex of heterogeneous two-dimensional materials and/or a method of manufacturing the same.

Additional aspects will be set forth in part in the description which follows and, in part, will be apparent from the description, or may be learned by practice of the presented embodiments of the disclosure.

According to an embodiment, a complex of heterogeneous two-dimensional materials may include a substrate; a first two-dimensional material layer having a two-dimensional crystal structure on the substrate; and a second two-dimensional material layer having a two-dimensional crystal structure between the substrate and the first two-dimensional material layer. The two-dimensional crystal structure of the second two-dimensional material layer may include a plurality of phosphorus atoms covalently bonded to each other.

In some embodiments, the first two-dimensional material layer may include graphene, hexagonal-boron nitride (h-BN), or transition metal dichalcogenide (TMD).

In some embodiments, the second two-dimensional material layer may include violet phosphorus.

In some embodiments, the second two-dimensional material layer may further include black phosphorus.

In some embodiments, the second two-dimensional material layer may be in a partial region between the substrate and the first two-dimensional material layer.

In some embodiments, the first two-dimensional material layer may be bonded to the substrate by van der Waals force in an other region between the substrate and the first two-dimensional material layer.

In some embodiments, the first two-dimensional material and the second two-dimensional material layer may each have a thickness of 10 nm or less.

According to another embodiment, a method of manufacturing a complex of heterogeneous two-dimensional materials may include forming a phosphorus precursor film on a substrate; forming a first two-dimensional material layer having a two-dimensional crystal structure on the phosphorus precursor film, and forming a second two-dimensional material layer having a two-dimensional crystal structure on the substrate. The two-dimensional crystal structure of the second two-dimensional material layer may include a plurality of phosphorus atoms covalently bonded to each other and may be formed by locally irradiating a laser beam onto the phosphorus precursor film.

In some embodiments, the phosphorus precursor film may include white phosphorus, red phosphorus, phosphorus triiodide ($PI_3$), or phosphorus trichloride ($PCl_3$).

In some embodiments, the forming the second two-dimensional material layer may include irradiating a region of the phosphorus precursor film using the laser beam during the locally irradiating the laser beam onto the phosphorus precursor film, and the region of the phosphorus precursor film may be heated to a temperature of about 400° C. to about 1,000° C. by the irradiating the region of the phosphorus precursor film using the laser beam.

In some embodiments, during the forming the second two-dimensional material layer, the region of the phosphorus precursor film may be heated to a temperature of about 500° C. to about 700° C. by the irradiating the region of the phosphorus precursor film using the laser beam.

In some embodiments, during the forming the second two-dimensional material layer, the irradiating the region of the phosphorus precursor film using the laser beam may be performed at atmospheric pressure.

In some embodiments, the second two-dimensional material layer may include at least one of violet phosphorus and black phosphorus.

In some embodiments, the method may further include performing a heat treatment process on the second two-dimensional material layer and the phosphorus precursor film.

In some embodiments, the phosphorus precursor film may be removed by the heat treatment process.

In some embodiments, after the performing the heat treatment process, the first two-dimensional material layer may be bonded to the substrate by van der Waals force at a region of the substrate from which the phosphorus precursor film is removed.

In some embodiments, the performing the heat treatment process may be performed at a temperature of about 400° C. to about 700° C. The performing the heat treatment process may be performed at a temperature of about 400° C. to about 500° C.

In some embodiments, the first two-dimensional material layer and the second two-dimensional material layer may be each formed to have a thickness of 10 nm or less.

According to another embodiment, an electronic device may include a substrate; a first two-dimensional material layer having a two-dimensional crystal structure on the substrate; a second two-dimensional material layer having a two-dimensional crystal structure between the substrate and the first two-dimensional material layer, the two-dimensional crystal structure of the second two-dimensional material layer including a plurality of phosphorus atoms covalently bonded to each other; a first electrode on a first side of the second two-dimensional material layer; a second electrode on a second side of the second two-dimensional material layer; and a third electrode on the first two-dimensional material layer.

In some embodiments, the second two-dimensional material layer may include violet phosphorus.

In some embodiments, the second two-dimensional material layer may further include black phosphorus.

In some embodiments, the first electrode and the second electrode may form edge contacts, respectively, with the first side of the second two-dimensional material layer and the second side of the second two-dimensional material layer.

In some embodiments, the first two-dimensional material layer may include hexagonal-boron nitride (h-BN).

In some embodiments, the first electrode and the second electrode may be provided to form planar contacts, respectively, with a first end of the second two-dimensional material layer and a second end of the second two-dimensional material layer.

In some embodiments, the first two-dimensional material layer may include h-BN.

In some embodiments, the first two-dimensional material layer may include graphene and fluorinated graphene, the graphene of the first two-dimensional material layer may form planar contacts with the first electrode and the second electrode, respectively, and the fluorinated graphene may be between the first electrode and the second electrode.

In some embodiments, an insulating layer may be between the first two-dimensional material layer and the third electrode.

According to an embodiment, a complex of heterogeneous two-dimensional materials may include a substrate; a first two-dimensional material layer on the substrate, the first two-dimensional material layer including a first material having a two-dimensional crystal structure; and a second two-dimensional material layer between the substrate and the first two-dimensional material layer. The second two-dimensional material layer may include a second material having a two-dimensional crystal structure. The second material may include at least one of violet phosphorus and black phosphorus. The first material and the second material may be different from each other.

In some embodiments, the first material may include graphene, hexagonal-boron nitride (h-BN), or transition metal dichalcogenide (TMD).

In some embodiments, the at least one of violet phosphorus and black phosphorus in the second material may be black phosphorus.

In some embodiments, the first two-dimensional material layer may be directly on the second two-dimensional material layer.

In some embodiments, the substrate may be a semiconductor substrate or an insulating substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
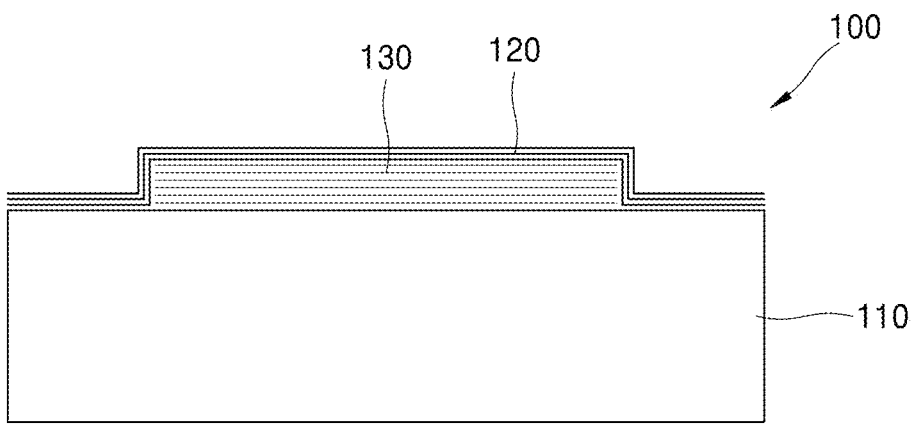
FIG. 1 is a cross-sectional view illustrating a complex of heterogeneous two-dimensional materials, according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described in detail with reference to the accompanying drawings. In the following drawings, the same reference numerals denote the same elements, and the size of each element in the drawings may be exaggerated for clarity and convenience of explanation. Embodiments described herein are merely examples, and various modifications may be made thereto from these embodiments.

Hereinafter, the terms "above" or "on" may include not only those that are directly above, below, left, or right in a contact manner, but also those that are above, below, left, or right in a non-contact manner. The singular forms "a," "an," and "the" as used herein are intended to include the plural forms as well unless the context clearly indicates otherwise. It will be understood that the terms "comprise," "include," or "have" as used herein specify the presence of stated elements, but do not preclude the presence or addition of one or more other elements.

The use of the term "the" and similar demonstratives may correspond to both the singular and the plural. Steps constituting methods may be performed in any suitable order unless otherwise indicated herein or otherwise clearly contradicted by context, and are not necessarily limited to the stated order.

Also, the terms such as "-er/or" and "module" described in the specification mean units that process at least one function or operation, and may be implemented as hardware, software, or a combination of hardware and software.

Connecting lines or connecting members illustrated in the drawings are intended to represent example functional relationships and/or physical or logical connections between the various elements. It should be noted that many alternative or additional functional relationships, physical connections or logical connections may be present in a practical device.

The use of all illustrations or illustrative terms in the embodiments is simply to describe the embodiment in detail, and the scope of the present disclosure is not limited due to the illustrations or illustrative terms unless they are limited by claims.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a cross-sectional view illustrating a complex 100 of heterogeneous two-dimensional materials, according to an example embodiment.

Referring to FIG. 1, the complex 100 of heterogeneous two-dimensional materials includes a substrate 110, a first two-dimensional material layer 120 provided on the substrate 110, and a second two-dimensional material layer 130 provided between the substrate 110 and the first two-dimensional material layer 120.

As the substrate 110, substrates of various materials, such as a semiconductor substrate or an insulating substrate, may be used. The second two-dimensional material layer 130 is provided on the substrate 110, and the first two-dimensional material layer 120 is provided on the substrate 110 to cover the second two-dimensional material layer 130.

The first two-dimensional material layer 120 may include a two-dimensional material having a two-dimensional crystal structure in which constituent atoms are two-dimensionally bonded to each other. The first two-dimensional material layer 120 may include a different two-dimensional material from that of the second two-dimensional material layer 130.

The first two-dimensional material layer 120 may have a single-layer structure or a multilayer structure. The first two-dimensional material layer 120 may have a thickness of, for example, about 10 nm or less. When the first two-dimensional material layer 120 has a multilayer structure, the stacked layers may be bonded to each other by van der Waals force.

The first two-dimensional material layer 120 may include, for example, graphene, which is a conductive two-dimensional material. Graphene is a two-dimensional material having a hexagonal honeycomb structure in which carbon atoms are two-dimensionally covalently bonded to each other.

When the first two-dimensional material layer 120 includes single-layer graphene, the first two-dimensional material layer 120 may have a thickness of about 0.34 nm. In addition, when the first two-dimensional material layer 120 includes multilayer graphene, the spacing between the stacked layers may be, for example, about 0.34 nm. The spacing between the stacked layers means the distance between the centers of the stacked layers.

The first two-dimensional material layer 120 may include, for example, hexagonal-boron nitride (h-BN), which is an insulating two-dimensional material. The first two-dimensional material layer 120 may include, for example, transition metal dichalcogenide (TMD), which is a two-dimensional material having semiconductor characteristics.

TMD is a two-dimensional material having excellent thermal stability and mechanical strength and high thermal conductivity. TMD may include, for example, a chalcogen element of one of Mo, W, Nb, V, Ta, Ti, Zr, Hf, Tc, Re, Cu, Ga, In, Sn, Ge, and Pb and one of S, Se, and Te. However, the materials described above are merely examples, and other materials may also be used as the TMD material.

The first two-dimensional material layer 120 may be provided on the substrate 110 to cover the second two-dimensional material layer 130. For example, both sides of the first two-dimensional material layer 120 may be provided to be in contact with the substrate 110, as illustrated in FIG. 1. In this case, both sides of the first two-dimensional material layer 120 may be bonded to the substrate 110 by van der Waals force. Moreover, the first two-dimensional material layer 120 may be bonded to the second two-dimensional material layer 130 located therebelow by van der Waals force.

The second two-dimensional material layer 130 may be provided in a partial region between the substrate 110 and the first two-dimensional material layer 120. For example, the second two-dimensional material layer 130 may be provided in a middle region between the substrate 110 and the first two-dimensional material layer 120.

The second two-dimensional material layer 130 may include a two-dimensional material having a two-dimensional crystal structure in which phosphorus (P) atoms are two-dimensionally covalently bonded to each other. Specifically, the second two-dimensional material layer 130 may include at least one of violet phosphorus and black phosphorus.

Unlike graphene, violet phosphorus and black phosphorus have semiconductor characteristics and have a certain bandgap energy. For example, violet phosphorus has a bandgap energy of about 1.7 eV to about 2.5 eV according to thickness thereof, and black phosphorus has a bandgap energy of about 0.3 eV to about 1.5 eV according to thickness thereof 130. Violet phosphorus and black phosphorus have a high charge mobility of about 1,000 $cm^2/Vs$ and a high on/off current ratio of about 104 to about 105. Accordingly, violet phosphorus and black phosphorus of the two-dimensional material may be used as channel materials in semiconductor devices, as described below, and may also be applied to electronic devices in various fields.

The second two-dimensional material layer 130 may have a single-layer structure or a multilayer structure. The second two-dimensional material layer 130 may include 1 to 50 layers, but the present disclosure is not limited thereto. The second two-dimensional material layer 130 may have a thickness of, for example, about 10 nm or less. When the second two-dimensional material layer 130 includes a single-layer structure, the second two-dimensional material layer 130 may have a thickness of about 0.5 nm.

The second two-dimensional material layer 130 may be bonded to the substrate 110 by van der Waals force. Also, the second two-dimensional material layer 130 may be bonded to the first two-dimensional material layer 120 located thereon by van der Waals force.

In the complex 100 of heterogeneous two-dimensional materials, according to the present embodiment, because the first two-dimensional material layer 120 is provided to cover the second two-dimensional material layer 130 including violet phosphorus and/or black phosphorus, the second two-dimensional material layer 130 may be protected from external influences such as oxidation. Also, because the second two-dimensional material layer 130 includes at least one of violet phosphorus and black phosphorus having semiconductor characteristics, a high charge mobility, and a high on/off current ratio, the complex 100 of heterogeneous two-dimensional materials may be applied to various electronic devices such as a field effect transistor (FET) or a photodetector.

Figure 2:
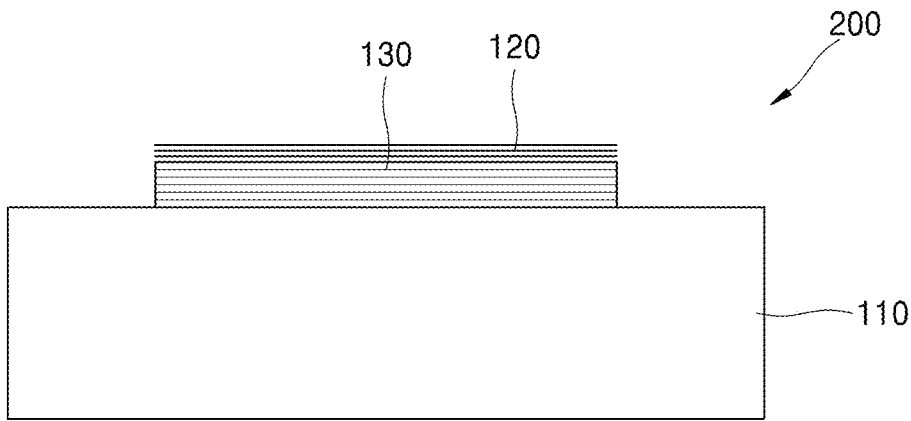
FIG. 2 is a cross-sectional view illustrating a complex of heterogeneous two-dimensional materials, according to another example embodiment.

FIG. 2 is a cross-sectional view illustrating a complex 200 of heterogeneous two-dimensional materials, according to another example embodiment.

Referring to FIG. 2, a first two-dimensional material layer 120 is provided on a substrate 110, and a second two-dimensional material layer 130 is provided between the substrate 110 and the first two-dimensional material layer 120. The first two-dimensional material layer 120 may include, for example, graphene, h-BN, or TMD, and the second two-dimensional material layer 130 may include at least one of violet phosphorus and black phosphorus. Because the first and second two-dimensional material layers 120 and 130 have been described above, a detailed description thereof is omitted.

In the present embodiment, the second two-dimensional material layer 130 may be provided where both sides thereof are exposed to the outside. The complex 200 of heterogeneous two-dimensional materials may be formed by etching both sides of the complex 100 of heterogeneous two-dimensional materials illustrated in FIG. 1.

FIGS. 3 to 8 are views for describing a method of manufacturing a complex 100 of heterogeneous two-dimensional materials, according to an example embodiment.

Figure 3:
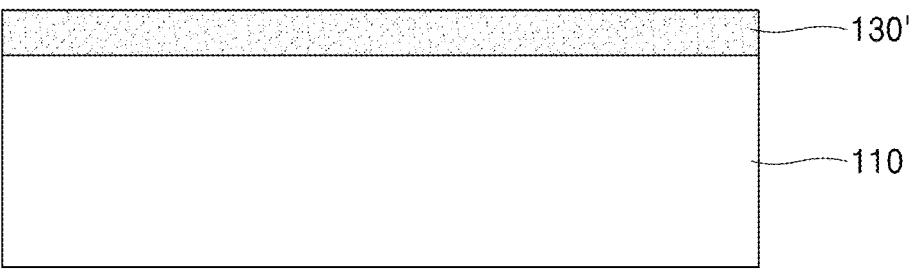
FIGS. 3 to 8 are views for describing a method of manufacturing a complex of heterogeneous two-dimensional materials, according to an example embodiment.

Referring to FIG. 3, a phosphorus precursor film 130' is formed on an upper surface of a substrate 110. As the substrate 110, substrates of various materials, such as a semiconductor substrate or an insulating substrate, may be used.

The phosphorus precursor film 130' may be formed to have a thickness of, for example, about 10 nm or less. The phosphorus precursor film 130' may include, for example, red phosphorus, white phosphorus, phosphorus triiodide (PI$_3$), or phosphorus trichloride (PCl$_3$).

For example, the phosphorus precursor film 130' may be formed by coating a solution including Pls or PCls on the upper surface of the substrate 110 and then reducing the solution to form a red phosphorus film. In addition, the phosphor precursor film 130' may be formed on the upper surface of the substrate 110 through vapor deposition of red phosphorus or white phosphorus.

Figure 4:
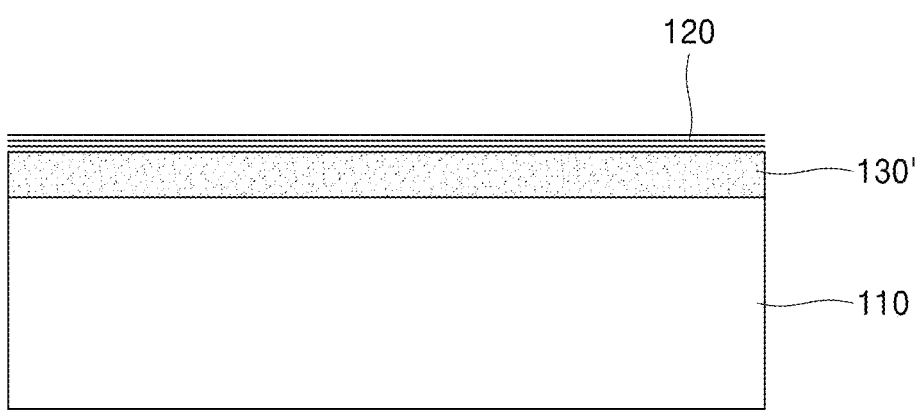

Referring to FIG. 4, a first two-dimensional material layer 120 is formed on the phosphorus precursor film 130'. The first two-dimensional material layer 120 may be formed on the phosphorus precursor film 130' through, for example, transfer. The first two-dimensional material layer 120 may be bonded to the phosphorus precursor film 130' located therebelow by van der Waals force.

The first two-dimensional material layer 120 may include a different two-dimensional material from that of the phosphorus precursor film 130'. The first two-dimensional material layer 120 may have a single-layer structure or a multi-layer structure. The first two-dimensional material layer 120 may have a thickness of, for example, about 10 nm or less.

The first two-dimensional material layer 120 may include, for example, graphene, which is a conductive two-dimensional material. The first two-dimensional material layer 120 may include, for example, h-BN, which is an insulating two-dimensional material. The first two-dimensional material layer 120 may include, for example, TMD, which is a two-dimensional material having semiconductor characteristics. TMD may include, for example, a chalcogen element of one of Mo, W, Nb, V, Ta, Ti, Zr, Hf, Tc, Re, Cu, Ga, In, Sn, Ge, Pb and one of S, Se, and Te. However, the materials described above are merely examples.

Figure 5:
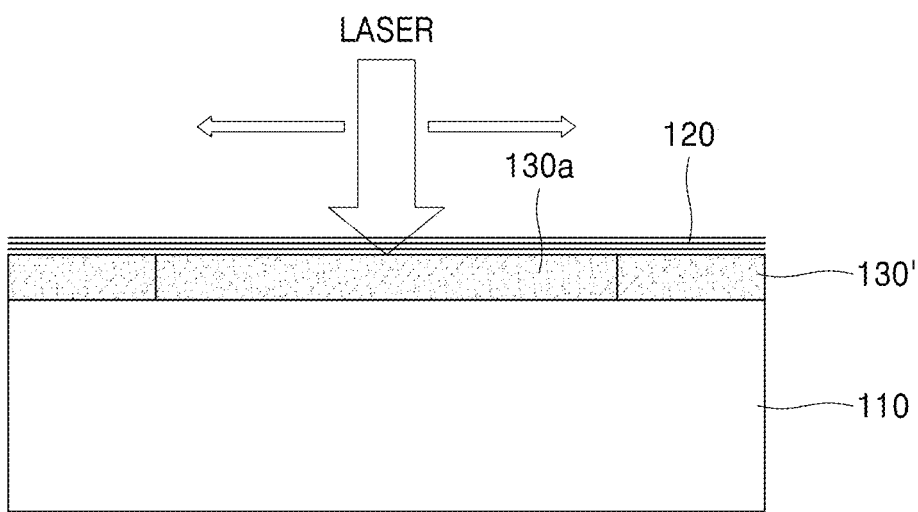

Referring to FIG. 5, a laser beam is locally irradiated onto a certain region 130a of the phosphorus precursor film 130'. Specifically, a laser irradiation apparatus (not illustrated) is provided above the first two-dimensional material layer 120, a laser beam from the laser irradiation apparatus is irradiated onto the phosphorus precursor film 130' through the first two-dimensional material layer 120, and then, the laser beam is shifted within the certain region 130a. FIG. 5 illustrates as an example a case in which the laser beam is irradiated onto the certain region 130a (e.g., the central region) of the phosphorus precursor film 130'.

The certain region 130a, onto which the laser beam is irradiated in the phosphorus precursor film 130', may be heated to a certain temperature. For example, the certain region 130a of the phosphorus precursor film 130' may be heated to a temperature of about 400° C. to about 1,000° C. by laser beam irradiation. As a specific example, the certain region 130a of the phosphorus precursor film 130' may be heated to a temperature of about 500° C. to about 700° C. by laser beam irradiation.

Figure 6:
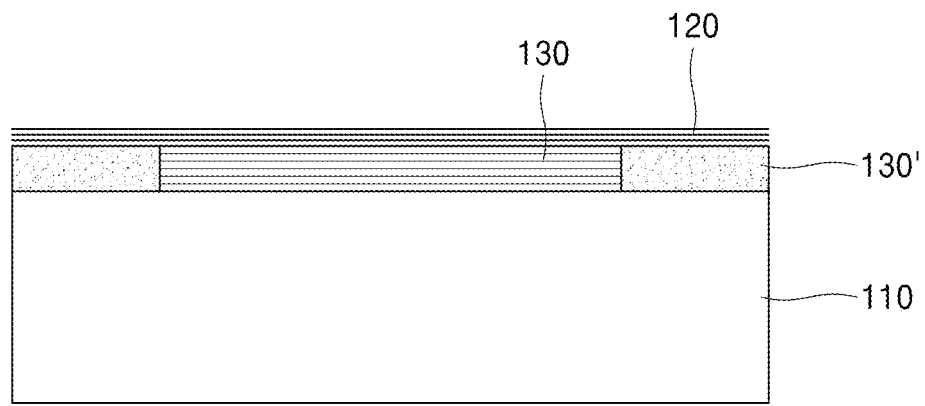

As such, when the laser beam is irradiated onto the certain region 130a of the phosphorus precursor film 130' and the certain region 130a is heated, a phosphorus precursor material (e.g., red phosphorus) may phase-transition to violet phosphorus or black phosphorus. Accordingly, as illustrated in FIG. 6, a second two-dimensional material layer 130 may be formed in the certain region 130a, onto which the laser beam is irradiated. The second two-dimensional material layer 130 may include violet phosphorus and/or black phosphorus. The second two-dimensional material layer 130 may have a single-layer structure or a multilayer structure according to the thickness of the phosphorus precursor film 130'. The second two-dimensional material layer 130 may have a thickness of about 10 nm or less according to the thickness of the phosphorus precursor film 130'.

In general, violet phosphorus or black phosphorus may be formed by heating red phosphorus or white phosphorus under a high pressure condition. However, in the present embodiment, the phosphorus precursor material may undergo a phase-transition to violet phosphorus or black phosphorus by laser beam irradiation even at relatively low pressure, such as atmospheric pressure, and the second two-dimensional material layer 130 may be formed accordingly.

The first two-dimensional material layer 120 is bonded to the phosphorus precursor film 130' by van der Waals force. In this case, very great van der Waals pressure may be applied to the phosphorus precursor film 130'. For example, when the first two-dimensional material layer 120 includes graphene, van der Waals pressure formed between the phosphorus precursor film 130' and the first two-dimensional material layer 120 may be about 1.0 GPa.

As such, when very great van der Waals pressure is applied to the phosphorus precursor film 130', the phosphorus precursor material may undergo a phase-transition to violet phosphorus or black phosphorus even at relatively low pressure, such as atmospheric pressure, by irradiating the laser beam onto the phosphorus precursor film 130'. Power of the laser beam irradiated onto the phosphorus precursor film 130' may be controlled so as to form violet phosphorus, black phosphorus, or a composite of violet phosphorus and black phosphorus. Accordingly, the second two-dimensional material layer 130 including violet phosphorus and/or black phosphorus may be formed between the substrate 110 and the first two-dimensional material layer 120.

The first two-dimensional material layer 120 formed on the phosphorus precursor film 130' may apply van der Waals pressure to the phosphorus precursor film 130' as described above, and may also improve the crystallization of black phosphorus or violet phosphorus in the process of forming violet phosphorus or black phosphorus. Moreover, because the first two-dimensional material layer 120 is formed to cover the second two-dimensional material layer 130, the first two-dimensional material layer 120 may prevent violet phosphorus or black phosphorus from being oxidized.

The second two-dimensional material layer 130 may be formed by irradiating the laser beam only onto the certain region 130a (e.g., the middle region) of the phosphorus precursor film 130', and the phosphorus precursor film 130' may remain in other regions (e.g., both sides) onto which the laser beam is not irradiated.

Figure 7:
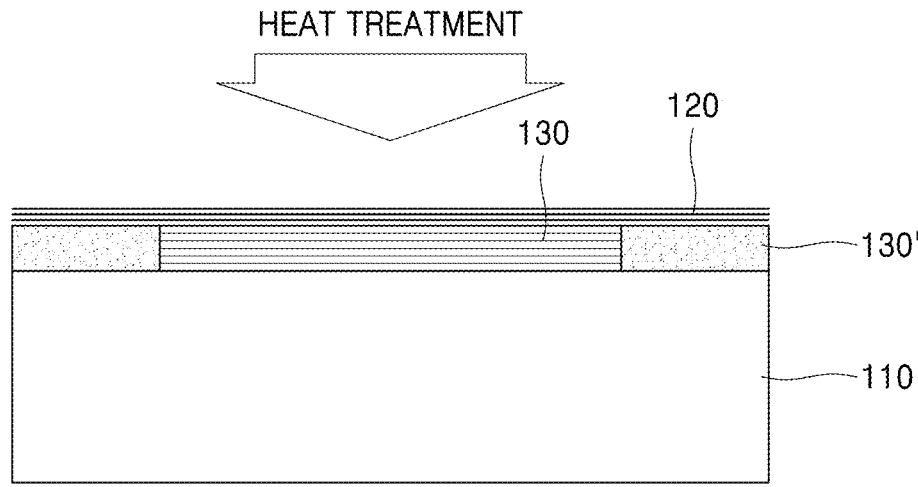

Referring to FIG. 7, a subsequent heat treatment process is performed on the structure illustrated in FIG. 6. The subsequent heat treatment process may be performed at a temperature of about 400° C. to about 700° C. As a specific example, the subsequent heat treatment process may be performed at a temperature of about 400° C. to about 500° C.

Figure 8:
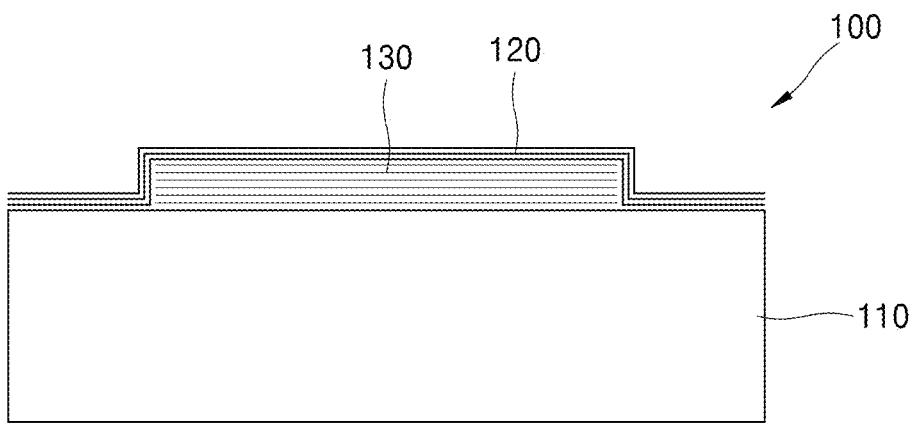

As illustrated in FIG. 8, the phosphorus precursor film 130' remaining on both sides of the second two-dimensional material layer 130 may be removed by the subsequent heat treatment process. Accordingly, both sides of the first two-dimensional material layer 120 may be provided to be in contact with the substrate 110. Both sides of the first two-dimensional material layer 120 may be bonded to the substrate 110 by van der Waals force. Also, the crystallinity of violet phosphorus or black phosphorus included in the second two-dimensional material layer 130 may be improved by the subsequent heat treatment process, and at least a portion of violet phosphorus may phase-transition to black phosphorus. By controlling the power of the laser beam and the temperature and time of the subsequent heat treatment process, the second two-dimensional material layer 130 may include violet phosphorus, black phosphorus, or a composite of violet phosphorus and black phosphorus.

Figure 9:
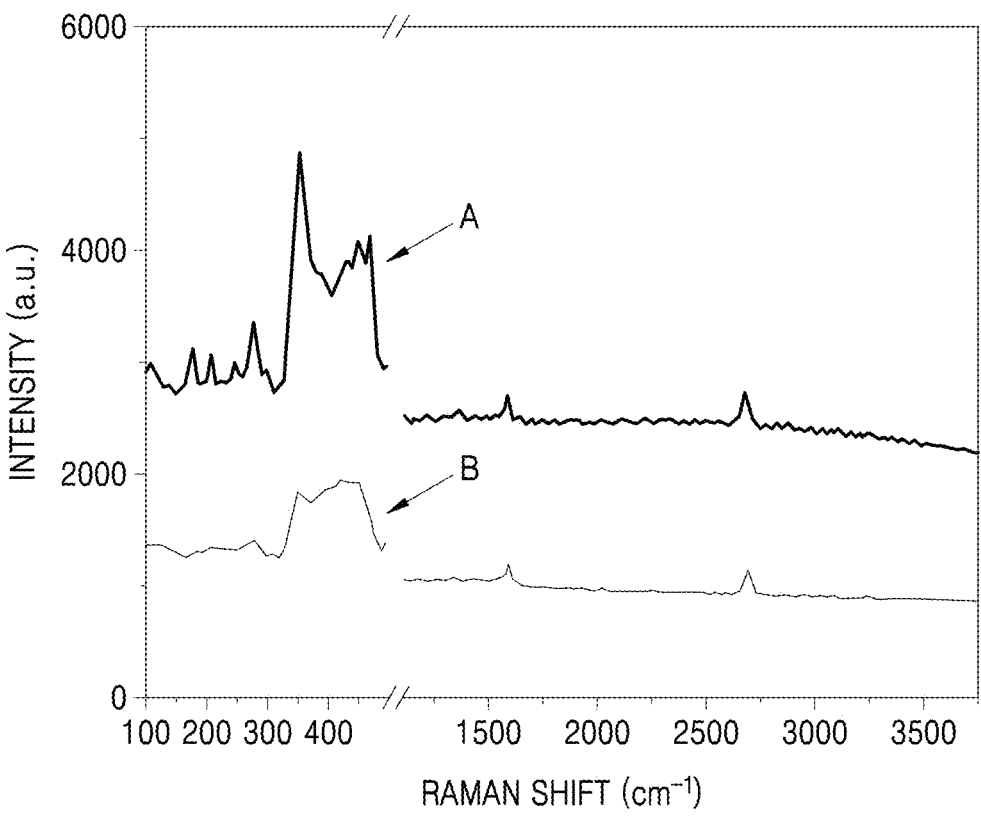
FIG. 9 illustrates Raman spectra measured in a region onto which a laser beam has been irradiated and a region onto which a laser beam has not been irradiated in a phosphorus precursor film including red phosphorus.

FIG. 9 illustrates Raman spectra measured in a region onto which a laser beam was irradiated and a region onto which a laser beam was not irradiated in a phosphorus precursor film. In FIG. 9, "A" represents the Raman spectrum of the region onto which the laser beam was irradiated in the phosphorus precursor film, and "B" represents the Raman spectrum of the region onto which the laser beam was not irradiated in the phosphorus precursor film. Red phosphorus was used as a phosphorus precursor material.

The wavelength, power, and irradiation time of the laser beam were 532 nm, 1 mW, and 30 seconds, respectively.

Referring to FIG. 9, it is observed that violet phosphorus was formed in the region onto which the laser beam was irradiated in the phosphorus precursor film including red phosphorus, but red phosphorus still remained in the region onto which the laser beam was not irradiated. From this, it may be confirmed that violet phosphorus was synthesized from red phosphorus by laser beam irradiation in the region onto which the laser beam was irradiated in the phosphorus precursor film including red phosphorus.

Figure 10:
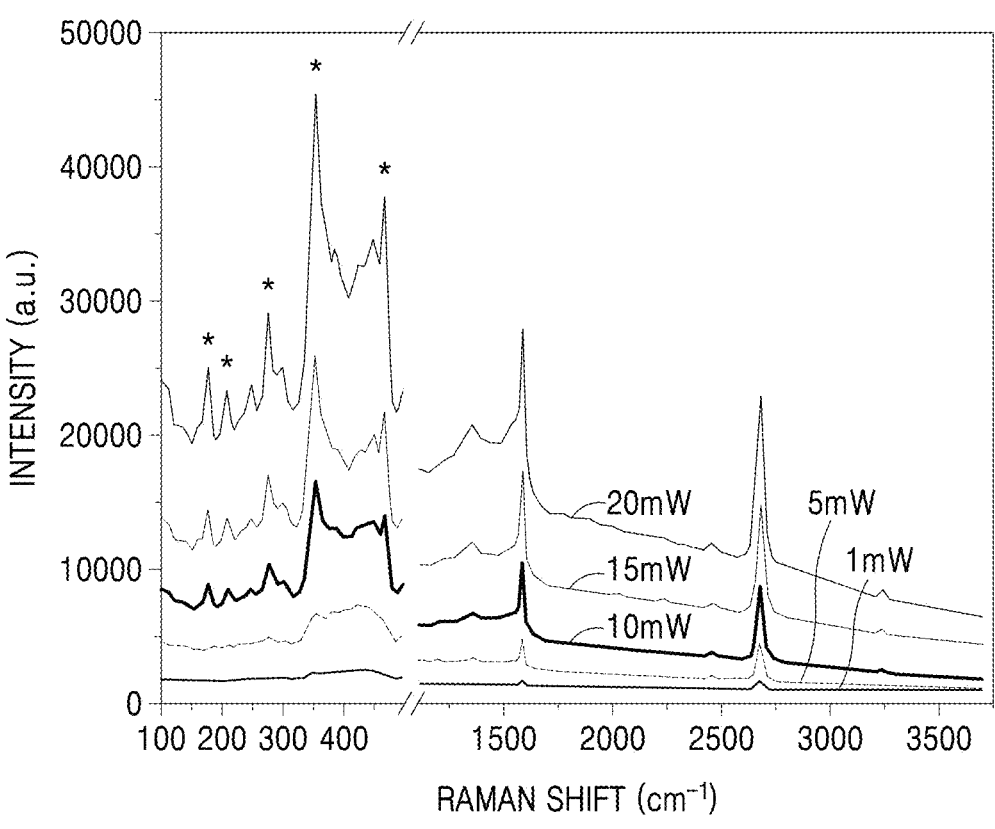
FIG. 10 illustrates Raman spectra according to an output of an irradiated laser beam in a phosphorus precursor film including red phosphorus.

FIG. 10 illustrates Raman spectra according to the output of the irradiated laser beam in the phosphorus precursor film. FIG. 10 shows measurement results obtained while changing the output of the laser beam to 1 mW, 5 mW, 10 mW, 15 mW, and 20 mW. Red phosphorus was used as the phosphorus precursor material. The wavelength and irradiation time of the laser beam were 532 nm and 60 seconds, respectively.

Referring to FIG. 10, it may be confirmed that as the output of the laser beam irradiated to the phosphorus precursor film including red phosphorus increases from 1 mW to 20 mW, violet phosphorus is further formed and the crystallinity of violet phosphorus is gradually improved.

Figure 11:
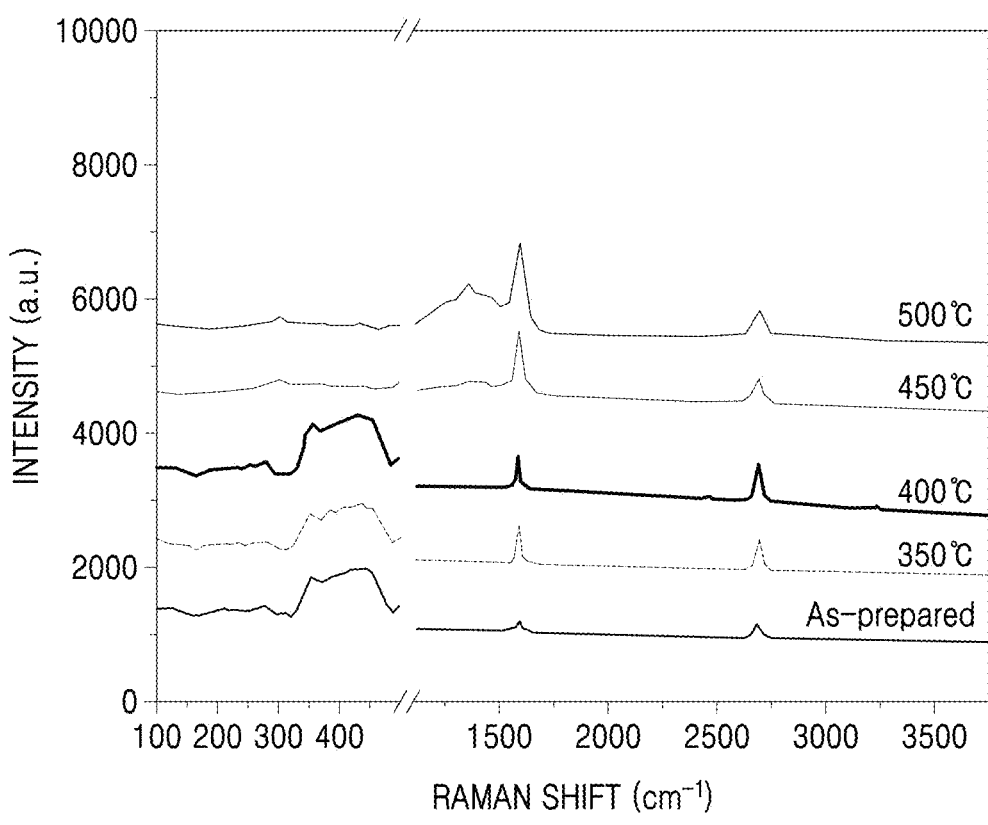
FIG. 11 illustrates spectra of red phosphorus according to a temperature of a subsequent heat treatment process after laser beam irradiation.

FIG. 11 illustrates spectra of red phosphorus according to a temperature of a subsequent heat treatment process after laser beam irradiation. FIG. 11 shows results obtained when the subsequent heat treatment process was performed at 350° C., 400° C., 450° C., and 500° C. The subsequent heat treatment process was performed in an Ar atmosphere for 10 minutes. Referring to FIG. 11, it may be confirmed that red phosphorus gradually decreased as the temperature of the subsequent heat treatment process increased, and red phosphorus was removed at a temperature of 450° C. or higher.

Figure 12:
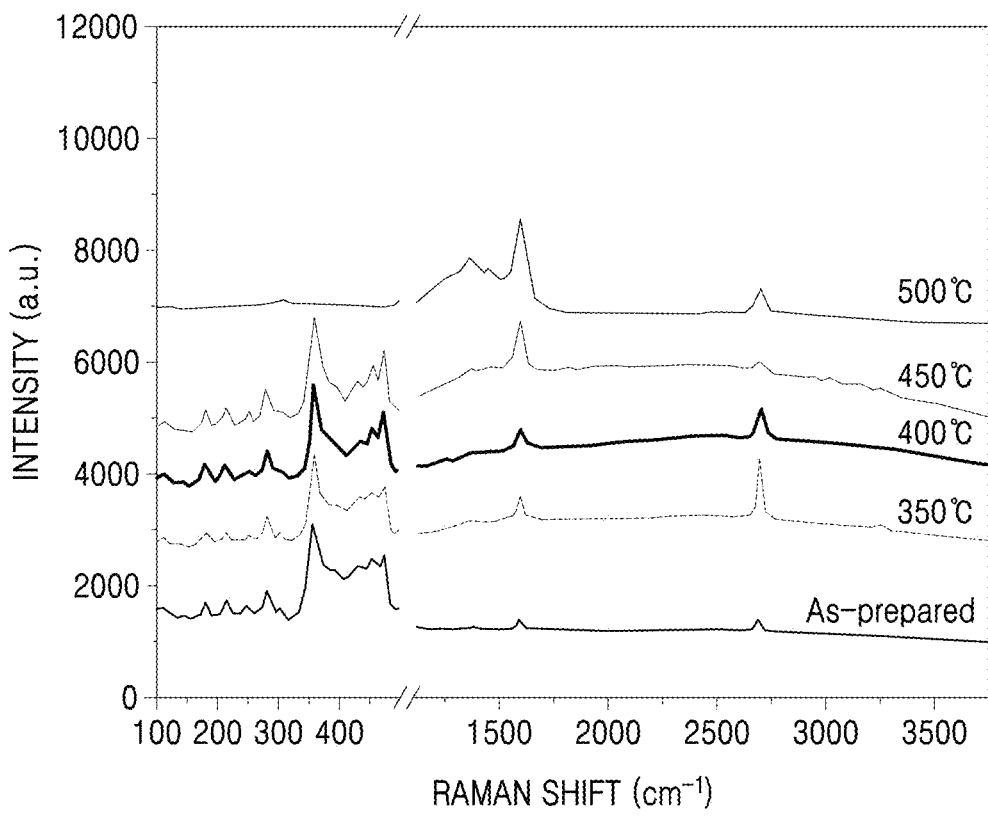
FIG. 12 illustrates spectra of violet phosphorus according to a temperature of a subsequent heat treatment process after laser beam irradiation.

FIG. 12 illustrates spectra of violet phosphorus according to a temperature of a subsequent heat treatment process after laser beam irradiation. FIG. 12 shows results obtained when the subsequent heat treatment process was performed at 350° C., 400° C., 450° C., and 500° C. The subsequent heat treatment process was performed in an Ar atmosphere for 10 minutes. Referring to FIG. 12, it may be confirmed that the crystallinity of violet phosphorus was improved as the temperature of the subsequent heat treatment process increased.

Figure 13:
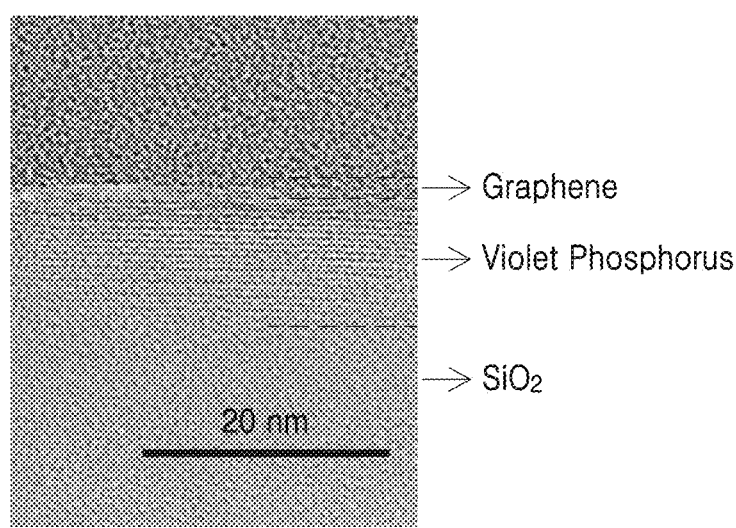
FIG. 13 is a transmission electron microscope (TEM) image of a cross-section of a complex of heterogeneous two-dimensional materials, which is formed by a subsequent heat treatment process, after laser beam irradiation.

FIG. 13 is a transmission electron microscope (TEM) image of a cross-section of a complex of heterogeneous two-dimensional materials, which is formed by a subsequent heat treatment process, after laser beam irradiation. FIG. 13 shows a result of performing the subsequent heat treatment process at 450° C. A $SiO_2$ substrate was used as the substrate, and graphene was used as the first two-dimensional material layer. Referring to FIG. 13, it may be confirmed that violet phosphorus constituting the second two-dimensional material layer was crystallized in a direction parallel to graphene thereon by the subsequent heat treatment process at 450° C.

As described above, violet phosphorus, black phosphorus, or a composite of violet phosphorus and black phosphorus may be formed from the phosphorus precursor film by controlling the power of the laser beam irradiated onto the phosphorus precursor film, the temperature and time of the subsequent heat treatment process, and the like.

The complex of heterogeneous two-dimensional materials described above may be applied to various electronic devices such as a FET or a photodetector.

Figure 14:
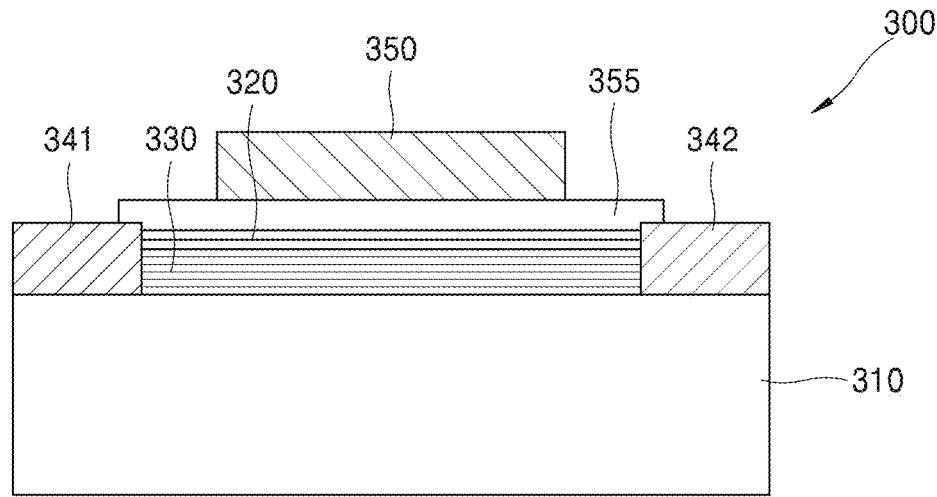
FIG. 14 is a cross-sectional view illustrating an electronic device according to an example embodiment.

FIG. 14 is a cross-sectional view illustrating an electronic device 300 (specifically, a FET) according to an example embodiment.

Referring to FIG. 14, the electronic device 300 includes a complex of heterogeneous two-dimensional materials, first and second electrodes 341 and 342 provided on both sides of the complex of heterogeneous two-dimensional materials, and a third electrode 350 provided on the complex of heterogeneous two-dimensional materials.

The complex of heterogeneous two-dimensional materials includes a substrate 310, a first two-dimensional material layer 320 provided on the substrate 310, and a second two-dimensional material layer 330 provided between the substrate 310 and the first two-dimensional material layer 320. The substrate 310 may include an insulating material.

The first two-dimensional material layer 320 may include a different two-dimensional material from that of the second two-dimensional material layer 300. The first two-dimensional material layer 320 may have a single-layer structure or a multilayer structure. The first two-dimensional material layer 320 may have a thickness of, for example, about 10 nm or less. The first two-dimensional material layer 320 may include, for example, h-BN, which is an insulating two-dimensional material.

The second two-dimensional material layer 330 may include a two-dimensional material having a two-dimensional crystal structure in which phosphorus (P) atoms are two-dimensionally covalently bonded to each other. Specifically, the second two-dimensional material layer 330 may include at least one of violet phosphorus and black phosphorus. The second two-dimensional material layer 330 may have a single-layer structure or a multilayer structure. The second two-dimensional material layer 330 may have a thickness of, for example, about 10 nm or less.

The second two-dimensional material layer 330 may be bonded to the substrate 310 by van der Waals force. Also, the second two-dimensional material layer 330 may be bonded to the first two-dimensional material layer 320 located thereon by van der Waals force.

The first and second electrodes 341 and 342 are provided on both sides of the complex of heterogeneous two-dimensional materials. The first and second electrodes 341 and 342 may be provided to form edge contact with both ends of the second two-dimensional material layer 330.

The first and second electrodes 341 and 342 may include a material having excellent conductivity. The first and second electrodes 341 and 342 may be a source electrode and a drain electrode, respectively. The second two-dimensional material layer 330, which is provided between the first electrode 341 as the source electrode and the second electrode 342 as the drain electrode, may act as a channel.

The third electrode 350 may be provided on the first two-dimensional material layer 320 between the first and second electrodes 341 and 342. The third electrode 350 may be a gate electrode. An insulating layer 355 may be provided between the first two-dimensional material layer 320 and the third electrode 350. The insulating layer 355 may be a gate insulating layer.

Figure 15:
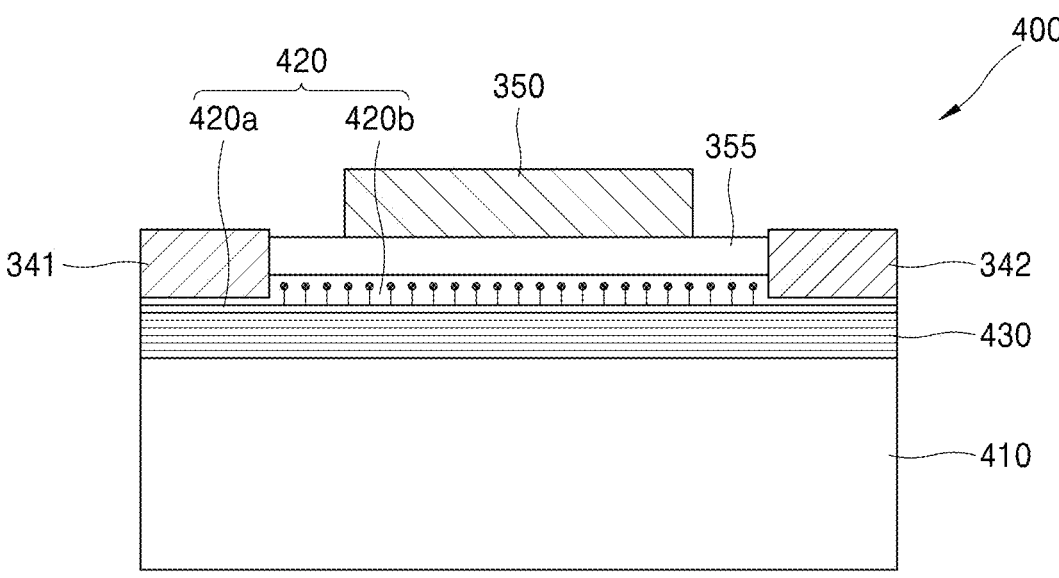
FIG. 15 is a cross-sectional view illustrating an electronic device according to another example embodiment.

FIG. 15 is a cross-sectional view illustrating an electronic device 400 (specifically, a FET) according to another example embodiment.

Referring to FIG. 15, the electronic device 400 includes a complex of heterogeneous two-dimensional materials, first and second electrodes 341 and 342 provided on both sides of the complex of the heterogeneous two-dimensional materials, and a third electrode 350 provided on the heterogeneous two-dimensional materials.

The complex of heterogeneous two-dimensional materials includes a substrate 410, a first two-dimensional material layer 420 provided on the substrate 410, and a second two-dimensional material layer 430 provided between the substrate 410 and the first two-dimensional material layer 420. A substrate including an insulating material may be used as the substrate 410. The second two-dimensional material layer 430 may include at least one of violet phosphorus and black phosphorus.

The first two-dimensional material layer 420, which is provided on the upper surface of the second two-dimensional material layer 430, may include fluorinated graphene 420b and graphene 420a provided on both sides of the fluorinated graphene 420b. The fluorinated graphene 420b is an insulating material, and may be formed by fluorinating the graphene 420a by using, for example, $XeF_2$ or $SF_6$.

The first and second electrodes 341 and 342 are provided on both sides of the complex of heterogeneous two-dimensional materials. The first and second electrodes 341 and 342 may be provided to form planar contact with the complex of heterogeneous two-dimensional materials. Specifically, the first and second electrodes 341 and 342 may be formed to be in contact with the graphene 420a provided on both sides of the fluorinated graphene 420b in the first two-dimensional material layer 420.

The first and second electrodes 341 and 342 may be a source electrode and a drain electrode, respectively. The second two-dimensional material layer 430 may act as a channel. The third electrode 350 may be provided on the first two-dimensional material layer 420 between the first and second electrodes 341 and 342, and an insulating layer 355 may be provided between the first two-dimensional material layer 420 and the third electrode 350. The third electrode 350 may be a gate electrode, and the insulating layer 355 may be a gate insulating layer.

Figure 16:
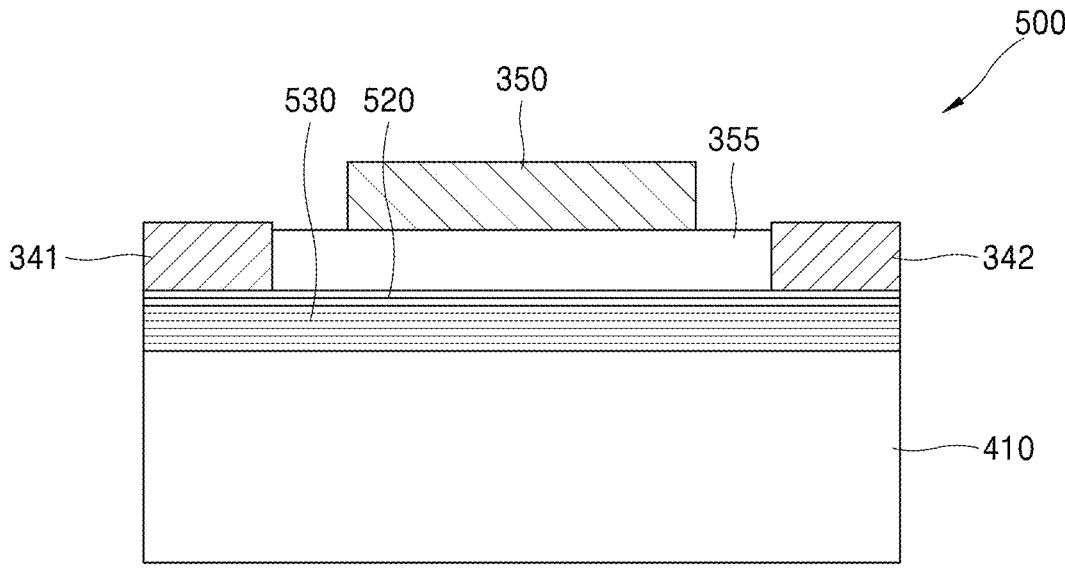
FIG. 16 is a cross-sectional view illustrating an electronic device according to another example embodiment.

FIG. 16 is a cross-sectional view illustrating an electronic device 500 (specifically, a FET) according to another example embodiment.

Referring to FIG. 16, the electronic device 500 includes a complex of heterogeneous two-dimensional materials, first and second electrodes 341 and 342 provided on both sides of the complex of the heterogeneous two-dimensional materials, and a third electrode 350 provided on the heterogeneous two-dimensional materials.

The complex of heterogeneous two-dimensional materials includes a substrate 410, a first two-dimensional material layer 520 provided on the substrate 410, and a second two-dimensional material layer 530 provided between the substrate 410 and the first two-dimensional material layer 520. A substrate including an insulating material may be used as the substrate 410. The second two-dimensional material layer 530 may include at least one of violet phosphorus and black phosphorus. The first two-dimensional material layer 520 may include an insulating two-dimensional material such as h-BN.

The first and second electrodes 341 and 342 are provided on both sides of the complex of heterogeneous two-dimensional materials. The first and second electrodes 341 and 342 may be provided to form planar contact with the complex of heterogeneous two-dimensional materials. Specifically, the first and second electrodes 341 and 342 may be provided to be in contact with the upper surfaces of both sides of the first two-dimensional material layer 520, respectively. The first and second electrodes 341 and 342 may be a source electrode and a drain electrode, respectively. The second two-dimensional material layer 530 may act as a channel. In this case, due to a tunneling effect, charges may move between the first electrode 341 and the second two-dimensional material layer 530 and between the second electrode 342 and the second two-dimensional material layer 530.

The third electrode 350 may be provided above the first two-dimensional material layer 520 between the first and second electrodes 341 and 342, and an insulating layer 355 may be provided between the first two-dimensional material layer 520 and the third electrode 350. The third electrode 350 may be a gate electrode, and the insulating layer 355 may be a gate insulating layer.

In the complex of heterogeneous two-dimensional materials, according to the example embodiment, because the first two-dimensional material layer including graphene, h-BN, or TMD is provided to cover the second two-dimensional material layer including violet phosphorus and/or black phosphorus, the second two-dimensional material layer may be protected from external influences such as oxidation. The second two-dimensional material layer may be formed by synthesizing violet phosphorus or black phosphorus from the phosphorus precursor material provided between the substrate and the first two-dimensional material layer by using the laser beam at room temperature and atmospheric pressure.

Because the second two-dimensional material includes at least one of violet phosphorus and black phosphorus having semiconductor characteristics, a high charge mobility, and a high on/off current ratio, the complex of heterogeneous two-dimensional materials may be applied to various electronic devices such as a FET or a photodetector.

Figure 17:
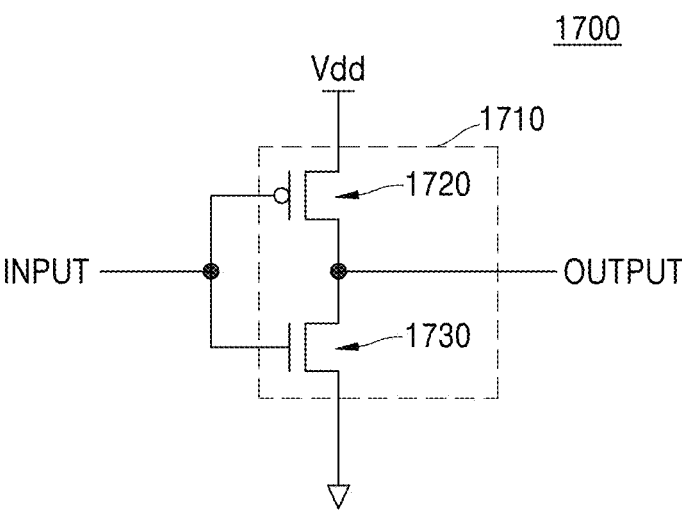
FIG. 17 is a circuit diagram of an inverter including an electronic device according to an example embodiment.

FIG. 17 is a circuit diagram of an inverter including an electronic device according to an example embodiment.

The inverter 1700 includes a circuit element 1710 including a p-type transistor 1720 and an n-type transistor 1730 disposed between a power terminal Vdd and a ground terminal. The transistors 1720 and 1730 each may include one of the electronic devices 300, 400, and 500 according to example embodiments in FIGS. 14 to 16.

Figure 18:
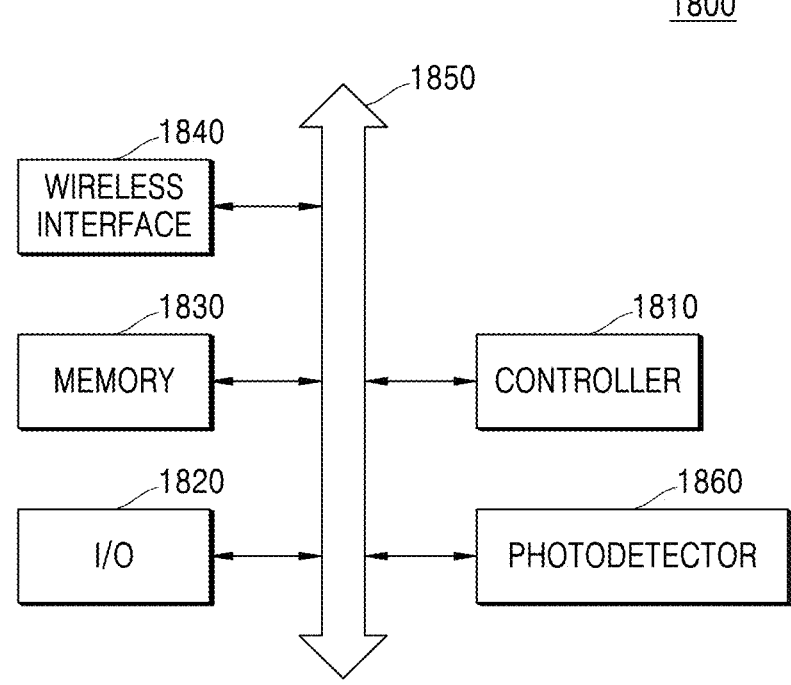
FIG. 18 is a block diagram of an electronic system including an electronic device according to an embodiment.

FIG. 18 is a block diagram of an electronic system including an electronic device according to an embodiment.

The electronic system 1800 may provide a wireless communication apparatus or an apparatus capable of transmitting and/or receiving information under a wireless environment. The electronic system 1800 includes a controller 1810, an input/output device (I/O) 1820, a memory 1830, a wireless interface 1840, and a photodetector 1860, which are interconnected to each other via a bus 1850.

The controller 1810 may include at least one of a microprocessor, a digital signal processor, or a processing device similar thereto. The I/O device 1820 may include at least one of a keypad, a keyboard, and a display. The memory 1830 may be used to store instructions executed by controller 1810. For example, the memory 1830 may be used to store user data. The electronic system 1800 may use the wireless interface 1840 to transmit/receive data via a wireless communication network. The wireless interface 1840 may include an antenna and/or a wireless transceiver. In some embodiments, the electronic system 1800 may be used in a communication interface protocol of a communication system, such as a code division multiple access (CDMA), a global system for mobile communications (GSM), a north American digital cellular (NADC), an extended-time division multiple access (E-TDMA), and/or a wide band code division multiple access (WCDMA), a fourth generation communication system such as 4G LTE, a fifth generation communication system and the like).

The memory 1830 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The controller 1810 may execute the stored program of instructions to perform one or more functions. For example, the controller 1810 may be configured to process electrical signals generated by the photodetector 1860. The controller 1810 may be configured to generate an output (e.g., signal corresponding to detected light intensity) based on such as processing. The electronic system 1800 may include one or more of the electronic devices 300, 400, and 500 according to example embodiments in FIGS. 14 to 16.

Although the presented embodiments have been described above, these are merely non-limiting examples, and various modifications may be made thereto by those of ordinary skill in the art.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A complex of heterogeneous two-dimensional materials, the complex comprising:
   a substrate;
   a first two-dimensional material layer having a two-dimensional crystal structure on the substrate;
   a second two-dimensional material layer having a two-dimensional crystal structure between the substrate and the first two-dimensional material layer, the two-dimensional crystal structure of the second two-dimensional material layer including a plurality of phosphorus atoms covalently bonded to each other; and
   a phosphorus precursor film surrounding the second two-dimensional material layer in a direction parallel to an upper surface of the substrate, wherein the first two-dimensional material layer covers the phosphorus precursor film and a structure of the phosphorus precursor film is different than the two-dimensional crystal structure of the second two-dimensional material layer.

2. The complex of claim 1, wherein the first two-dimensional material layer includes graphene, hexagonal-boron nitride (h-BN), or transition metal dichalcogenide (TMD), the substrate is a semiconductor material and the second two-dimensional material layer directly contacts the substrate.

3. The complex of claim 1, wherein the second two-dimensional material layer includes violet phosphorus.

4. The complex of claim 3, wherein the second two-dimensional material layer further includes black phosphorus.

5. The complex of claim 1, wherein the second two-dimensional material layer is in a partial region between the substrate and the first two-dimensional material layer.

6. The complex of claim 5, wherein the phosphorus precursor film includes white phosphorus, red phosphorus, phosphorus triiodide ($PI_3$), or phosphorus trichloride ($PCl_3$).

7. A method of manufacturing a complex of heterogeneous two-dimensional materials, the method comprising:

forming a phosphorus precursor film on a substrate;

forming a first two-dimensional material layer having a two-dimensional crystal structure on the phosphorus precursor film; and forming a second two-dimensional material layer having a two-dimensional crystal structure on the substrate, the two-dimensional crystal structure of the second two-dimensional material layer including a plurality of phosphorus atoms covalently bonded to each other and being formed by locally irradiating a laser beam onto a region of the phosphorus precursor film, wherein the second two-dimensional material layer is formed in the region of the phosphorus precursor film, after the second two-dimensional material layer is formed, the phosphorus precursor film surrounds the second two-dimensional material layer in a direction parallel to an upper surface of the substrate, the first two-dimensional material layer covers the phosphorus precursor film, and a structure of the phosphorus precursor film is different than the two-dimensional crystal structure of the second two-dimensional material layer.

8. The method of claim 7, wherein the phosphorus precursor film includes white phosphorus, red phosphorus, phosphorus triiodide ($PI_3$), or phosphorus trichloride ($PCl_3$).

9. The method of claim 7, wherein the forming the second two-dimensional material layer includes irradiating a region of the phosphorus precursor film using the laser beam during the locally irradiating the laser beam onto the phosphorus precursor film, and the region of the phosphorus precursor film is heated to a temperature of about 400° C. to about 1,000° C. by the irradiating the region of the phosphorus precursor film using the laser beam.

10. The method of claim 9, wherein during the forming the second two-dimensional material layer, the region of the phosphorus precursor film is heated to a temperature of about 500° C. to about 700° C. by the irradiating the region of the phosphorus precursor film using the laser beam.

11. The method of claim 9, wherein during the forming the second two-dimensional material layer, the irradiating the region of the phosphorus precursor film using the laser beam is performed at atmospheric pressure.

12. The method of claim 7, wherein the second two-dimensional material layer includes at least one of violet phosphorus and black phosphorus.

13. The method of claim 7, further comprising:

performing a heat treatment process on the second two-dimensional material layer and the phosphorus precursor film.

14. The method of claim 13, wherein the phosphorus precursor film is removed by the heat treatment process.

15. The method of claim 14, wherein after the performing the heat treatment process, the first two-dimensional material layer is bonded to the substrate by van der Waals force at a region of the substrate from which the phosphorus precursor film is removed.

16. An electronic device comprising:

a substrate;

a first two-dimensional material layer having a two-dimensional crystal structure on the substrate;

a second two-dimensional material layer having a two-dimensional crystal structure between the substrate and the first two-dimensional material layer, the two-dimensional crystal structure of the second two-dimensional material layer including a plurality of phosphorus atoms covalently bonded to each other;

a first electrode on a first side of the second two-dimensional material layer;

a second electrode on a second side of the second two-dimensional material layer; and a third electrode on the first two-dimensional material layer, wherein a portion of the first two-dimensional material layer extends between the second two-dimensional material layer and an entire lower surface of the first electrode, wherein the first electrode and the second electrode form planar contacts, respectively, with a first end of the first two-dimensional material layer and a second end of the first two-dimensional material layer, and wherein the first two-dimensional material layer includes graphene and fluorinated graphene, the graphene of the first two-dimensional material layer forms planar contacts with the first electrode and the second electrode, respectively, and the fluorinated graphene is between the first electrode and the second electrode.

17. The electronic device of claim 16, further comprising:

an insulating layer between the first two-dimensional material layer and the third electrode.

* * * * *